(12) United States Patent
Nyhus et al.

(10) Patent No.: US 11,545,449 B2
(45) Date of Patent: Jan. 3, 2023

(54) GUARD RING STRUCTURE FOR AN INTEGRATED CIRCUIT

(71) Applicant: INTEL CORPORATION, Santa Clara, CA (US)

(72) Inventors: Paul A. Nyhus, Portland, OR (US); Gurpreet Singh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1045 days.

(21) Appl. No.: 16/017,409

(22) Filed: Jun. 25, 2018

(65) Prior Publication Data
US 2019/0393170 A1 Dec. 26, 2019

(51) Int. Cl.
| H01L 23/58 | (2006.01) |
| H01L 23/00 | (2006.01) |
| H01L 29/34 | (2006.01) |
| H01L 21/768 | (2006.01) |
| H01L 23/31 | (2006.01) |

(52) U.S. Cl.
CPC ...... *H01L 23/585* (2013.01); *H01L 21/76838* (2013.01); *H01L 23/3171* (2013.01); *H01L 23/562* (2013.01); *H01L 29/34* (2013.01); H01L 23/564 (2013.01)

(58) Field of Classification Search
CPC ... H01L 23/585; H01L 23/564; H01L 23/562; H01L 23/528
See application file for complete search history.

(56) References Cited

U.S. PATENT DOCUMENTS

| 5,270,256 | A | 12/1993 | Bost et al. |
| 5,811,874 | A * | 9/1998 | Lee .......................... H01L 23/58 |
| | | | 257/676 |
| 6,509,622 | B1 | 1/2003 | Ma et al. |
| 6,906,355 | B2 * | 6/2005 | Kurosaki .............. H01L 29/872 |
| | | | 257/490 |
| 7,301,241 | B2 * | 11/2007 | Watanabe ........... H01L 29/0619 |
| | | | 257/734 |
| 8,008,734 | B2 * | 8/2011 | Wakimoto ............ H01L 29/404 |
| | | | 257/490 |
| 8,749,014 | B2 | 6/2014 | Yoo |

(Continued)

OTHER PUBLICATIONS

"The Promise of DSA Technology for Nanoscale Manufacturing", The Institute for Molecular Engineering, retrieved online Mar. 21, 2018, 2 pages.

*Primary Examiner* — Mark W Tornow
*Assistant Examiner* — Abbigale A Boyle
(74) *Attorney, Agent, or Firm* — Schwabe, Williamson & Wyatt, P.C.

(57) ABSTRACT

A guard ring structure includes a plurality of first groups of concentric guard rings encompassing an active region of an integrated circuit, the concentric guard rings of the first groups having a guard ring pitch of less than 80 nm. The concentric guard rings of the first groups have a single, closed path that is distinct from an adjacent guard ring and defines a rectangular geometry with rounded corners. Second groups of guard rings are interspersed with and concentrically arranged with the first groups, where each corner region of the second groups include at least one guard ring defect. A method of fabricating a guard ring structure for an integrated circuit is also disclosed.

16 Claims, 6 Drawing Sheets

(56) References Cited

U.S. PATENT DOCUMENTS

| | | | |
|---|---|---|---|
| 8,786,092 B2 * | 7/2014 | Okazaki | H01L 23/528 257/260 |
| 8,890,293 B2 * | 11/2014 | Lu | H01L 21/76 257/490 |
| 9,530,813 B2 * | 12/2016 | Chien | H01L 23/562 |
| 9,679,896 B2 * | 6/2017 | Yoon | H01L 23/585 |
| 10,304,781 B2 * | 5/2019 | Baek | H01L 23/562 |
| 2002/0167071 A1 * | 11/2002 | Wang | H01L 23/585 257/620 |
| 2015/0021713 A1 | 1/2015 | Cheng et al. | |

* cited by examiner

GUARD RING STRUCTURE FOR AN INTEGRATED CIRCUIT

BACKGROUND

Integrated circuits are commonly formed in large quantities on a semiconductor wafer and then are cut into individual dies for further processing. This additional processing, sometimes referred to as the packaging process, can include wafer dicing, die bonding, wire bonding, encapsulation, lead finishing, marking, lead forming, and packing. The packaging process can subject each die to various mechanical stresses. For example, molten polymers applied to the die for encapsulation, and other processes involving heat, can mechanically stress a die due to different coefficients of thermal expansion among components of the die and packaging. Dicing and cleaning subject the die to vibration and other mechanical stress. Regardless of the source, mechanical stress on a die can ultimately result in failure of devices and interconnects. In some integrated circuits, for example, interconnects are fabricated from high-conductivity materials embedded in dielectric materials, some of which have low strength. The interconnects connecting various active and passive devices can be sheared or fractured due to mechanical stresses, resulting in a catastrophic or intermittent failure modes for the integrated circuit.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Aspects of the present disclosure relate to a guard ring structure for integrated circuits and methodologies for making a guard ring structure, in accordance with some embodiments. The methodologies effectively allow defects to occur in the guard ring structure, but confine those to "don't care regions" rendering them harmless. The "care regions" are relatively clean, in that they are defect-free or otherwise free of defects comparable to defects in the don't care regions or that otherwise would be considered problematic with respect to performance and reliability issues. As will be appreciated in light of this disclosure, the term defect-free is a relative term, and is not intended to be interpreted as requiring true perfection. In particular, some degree of acceptable or minor defect may be present, but relative to other more severe defects, are a non-issue with respect to factors such as device performance and reliability. In one embodiment, a guard ring structure has a plurality of concentric guard rings extending in a closed loop around an active region containing one or more semiconductor device. For example, the guard ring structure includes two or more sound groups of concentric, generally rectangular guard rings with rounded corners, where each sound group includes from one to ten guard rings. Each guard ring in the sound group has a single path that defines a closed geometry and is distinct from adjacent guard rings. Flawed groups of guard rings are interspersed in a concentric arrangement with the sound groups of guard rings. The guard ring structure has one or more defect in one or more corner regions of the flawed groups, while the sound groups of guard rings are free or substantially free of defects (e.g., relative to defects of the flawed group). In some embodiments, defects in the guard ring structure are intentionally or otherwise predictably located along the diagonals of the rectangular shape, such as occurring in a periodic pattern. In some example embodiments, every corner region of the flawed groups has one or more defect, resulting in a repeating pattern along the diagonal of defect-free corner regions and corner regions with defects. A defect may be, for instance, a break in continuity, dislocation, and/or a disclination. In some embodiments, the rounded corners of each sound group of guard rings have a common series of increasing radii of curvature from the radially innermost corner to the radially outermost corner of the sound group. For example, the first guard ring of each sound group has the same radius of curvature and starts a series of increasing radii for corners in the sound group. Numerous variations and embodiments will be apparent in light of the present disclosure.

Methodologies for making a guard ring structure are also disclosed. In one example, pinning stripes are defined around an active region, where the pinning stripes have a pinning stripe pitch selected as a whole-number multiple of the desired pitch of the guard ring structure. The pinning stripes define a rectangular shape and are concentrically arranged around the active region. Along the diagonal of the pinning stripe structure, the corners of the pinning stripes alternate between a right-angle corner and a rounded corner. A block copolymer solution for directed self-alignment (DSA solution) is provided, where the DSA solution is configured to result in alternating regions of block copolymers with a DSA pitch of less than 80 nm. For example, the DSA solution contains block copolymers configured produce alternating lines of polystyrene (PS) and polymethylmethacrylate (PMMA) with a DSA pitch from about 15 to 30 nm, in accordance with some embodiments. The pinning stripe pitch is selected as a whole-number multiple of the DSA pitch, and is generally greater than about 80 nm, such as 120 nm or 150 nm in some examples. The DSA solution is applied over the pining stripe structure and annealed to cause the block copolymers to self-align along the pinning stripes.

As a result of the alternating right-angle corners and rounded corners, the polymers align to define first groups of guard rings interspersed with second groups of guard rings. For example, the first groups of guard rings have corners between the outside of a right-angle corner and the inside of a rounded corner. The corners of the first groups are free of defects. Between the outside of a right-angle corner and the inside of a rounded corner of the pinning stripe structure, the lines of copolymers define rounded corners without defects since the distance between the pinning stripes at this location is largely consistent with the DSA pitch. The second groups of guard rings have corners between the outside of a rounded corner and the inside of a right-angle corner. The corners of the second groups have at least one defect, such as a discontinuity. The distance between the outside of the rounded corner and the inside of the right-angle corner of the pinning stripe structure is incommensurate with the DSA pitch and results in defects in these corner regions.

One of the block copolymers is removed and the remaining block copolymer can be used as a mask for subsequent lithographic processing of the ultimate guard ring structure. For example, using the first polymer as a mask, channels can be etched into the substrate and then filled with a metal to define the guard ring structure. Numerous variations and embodiments will be apparent in light of the present disclosure. By structuring the pinning stripe structure to favor defects forming in the corner regions of the flawed groups of guard rings, the guard ring structure avoids randomly or otherwise unpredictably located defects and provides groups of concentric guard rings with no defects or with relatively minor defects.

General Overview

With the ongoing desire to produce smaller, higher performing, and more reliable electronic devices, various challenges arise in the manufacturing of integrated circuits. In back-end-of-line processing (BEOL), for example, guard rings can be defined around a semiconductor device, circuit, or other active region. The guard ring structure is useful to electrically isolate semiconductor devices located in the active region. The guard ring structure can alternately or additionally be useful to improve structural integrity to an integrated circuit (IC) or an IC die, for example. A guard ring structure may include multiple, sometimes many, guard rings concentrically arranged around an active region. In addition to isolation and structural benefits, including numerous guard rings in a guard ring structure provides redundancy in the event that one or more of the guard rings has a defect, such as a dislocation (e.g., a discontinuity or break), a disclination (e.g., a misorientation, overlap, or merging guard lines), or a closed-loop defect formed at corner regions, for example.

Some semiconductor processing uses photoresist to define conductive traces in the electrically active regions as well as to define guard rings. In such a method, photoresist is applied to the substrate, patterned, and then developed to remove the non-polymerized resist and leave behind a mask pattern for the desired structure. A limitation of some photo-resist methods is that the tightest pitch is generally about 80 nm or greater for lithography utilizing an argon-fluoride (ArF) laser, and about 45 nm for extreme ultraviolet (EUV) lithography. This pitch is disfavored in some situations because it consumes large areas on the die or integrated circuit. One possible approach is to use a directed self-alignment (DSA) copolymer solution to achieve even tighter pitches for guard rings and other structures. A DSA solution has two block copolymers that orient themselves along guide structures, such as a pinning stripe of photoresist or other material. Molecules of DSA block copolymers consistently align in alternating lines with a single, consistent DSA pitch. The use of directed self-alignment is particularly effective to provide parallel-line structures with a pitch of about 10-50 nm, such as 18-30 nm. However, a general challenge with DSA is that the molecules of the copolymers orient poorly along concentric rounded corners. When making a rectangular guard ring, for example, the copolymers would tend to define a rounded corner. When the guard ring structure includes many successive corners along a diagonal, the pitch at the corner regions is greater than the DSA pitch by a factor of $\sqrt{2}$. This deviation from the DSA pitch results in random defects at the corners, such as dislocations, disclinations, and unexpected loops as the molecules align to define a shape having the DSA pitch in the available space. For example, one guard ring may deviate from the intended path and merge with the neighboring guard ring. In another example scenario, the corner region of a guard ring may form an eyelet or other looped defect. In yet another example scenario, a guard ring may have a break or other discontinuity. Such defects would reduce the effectiveness of the guard ring structure since they would be randomly and unpredictably located throughout the guard ring structure and often include a break in continuity.

One possible approach to reduce the number of defects with DSA copolymers might be to form the corners of guard rings or other structures along an octagonal shape that more closely maintains the pitch of the DSA copolymer solution at the corners. Such an approach, however, means that the corner region of the structure is not aligned along X or Y axes and therefore occupies a relatively large amount of space on the die. Accordingly, significant design changes are required in layers above and below the given layer of the integrate circuit structure in addition to other challenges.

Corner regions based on higher order polygons, including true arcs at the corners, also exhibit such challenges and may still exhibit randomly located defects.

Another possible approach would be to define rounded corners in pinning lines in an attempt to maintain substantially equal spacing between guard rings as the rings turn the corner. As noted above, however, DSA molecules align poorly to curves due to the incommensurability with the DSA pitch at the corners and the resulting guard ring structure may still include randomly located defects. Therefore, a need exists for methodologies for forming a guard ring structure for an integrated circuit or die, particularly where it is possible to control the location of the defects in the guard ring structure.

In accordance with an embodiment of the present disclosure, a die includes an active area encircled by a guard ring structure as viewed from above. The active area generally includes one or more active semiconductor devices (e.g., transistors, diodes), passive devices (e.g., resistors, capacitors, inductors), and interconnects assembled to form an integrated circuit. The active area can include devices and interconnects that are diffused, implanted, deposited, or otherwise formed in layers of semiconductor materials on a substrate. The active area generally does not extend to the outer edge of the substrate to allow room for dicing the wafer into individual dies without damaging the active area, as will be appreciated.

The techniques described herein may be used to benefit any number of integrated circuits, such as logic transistor devices, input/output (I/O) transistor devices, sensors, signal processing, or any type of a functional circuit or device used for any number of applications (e.g., amplification, switching, etc.). Further, the techniques described herein can provide electrical isolation and/or structural integrity to a die, chip, or wafer with functional circuits of any type. In a more general sense, the techniques described herein can be used to benefit a multitude of integrated circuits and allow integrated circuits to be further scaled.

As used herein, terms referencing direction, such as upward, downward, vertical, horizontal, left, right, front, back, etc., are used for convenience to describe embodiments of integrated circuit structures having a base or substrate extending in a horizontal plane. Embodiments of the present disclosure are not limited by these directional references and it is contemplated that integrated circuits and guard ring structures in accordance with the present disclosure could be used in any orientation.

Use of the techniques and structures provided herein may be detectable using tools such as electron microscopy, including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. Such tools can be used to detect, for example, an integrated circuit or die with a guard ring structure having guard ring defects located periodically or predictably along diagonals of the guard ring structure, in accordance with various embodiments of the present disclosure. For example, TEM can be useful to show a cross section of a die taken through the diagonal of a generally rectangular guard ring structure, where the cross section reveals a repeating series of defect-free corner regions interspersed with corner regions containing defects. In another example, analytical tools can be used to detect guard ring structures with a pitch of 80 nm or less and including rectangular guard rings with rounded corners, where the radii of curvature of the corners of sound groups of guard rings increase according to a pattern common to the sound groups. In some embodiments, the techniques described herein may be detected based on the benefits derived from their use, which may include improved electrical isolation, improved structural integrity, and/or reduced overall die size, according to some embodiments. Numerous configurations and variations will be apparent in light of this disclosure.

Architecture and Methodology

Figure 1:
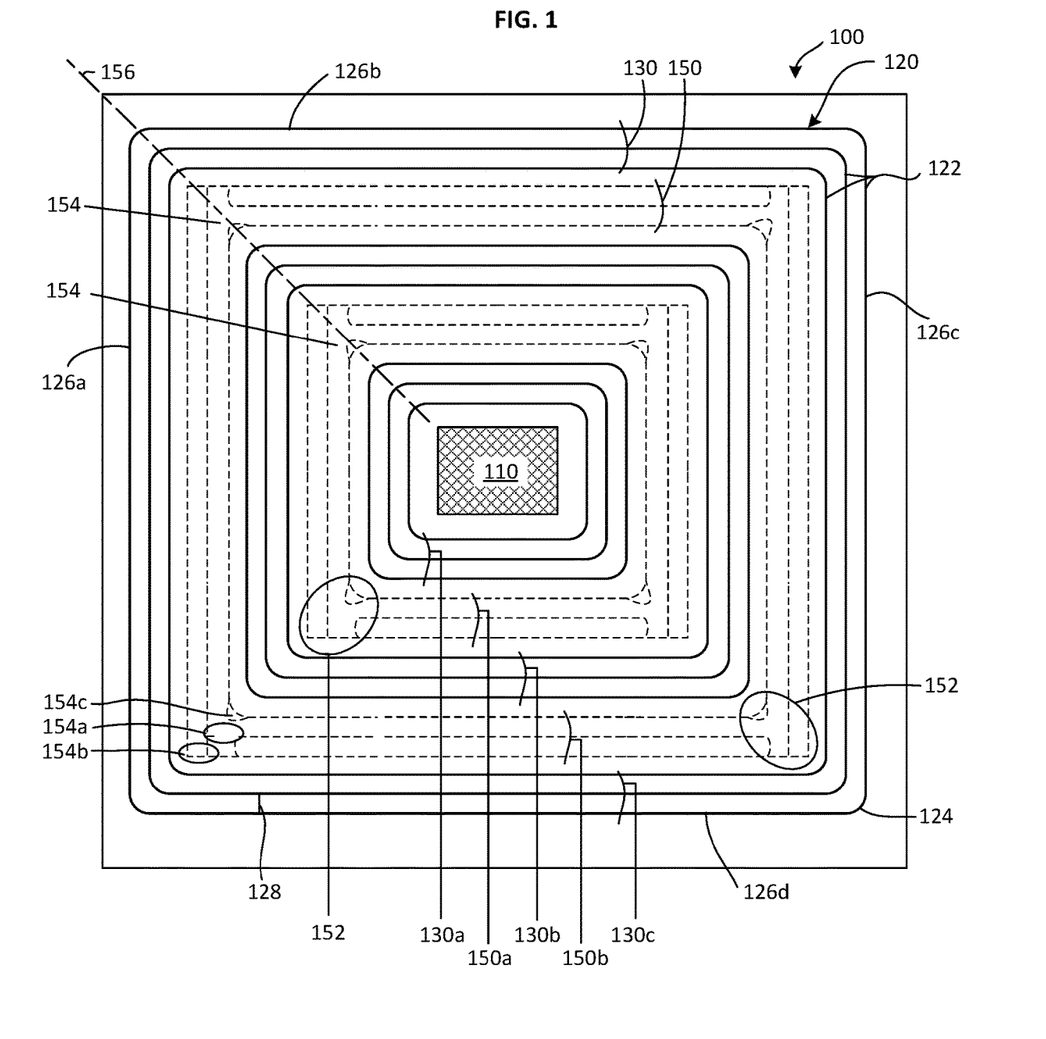
FIG. 1 illustrates a top plan view of an integrated circuit die with a guard ring structure that has concentric guard rings surrounding an active region of the integrated circuit, where the guard ring structure includes sound groups of guard rings interspersed with flawed groups of guard rings, in accordance with an embodiment of the present disclosure.

An aspect of the present disclosure relates to methodologies for forming a guard ring structure as part of an integrated circuit. FIG. 1 illustrates a top-down view of an integrated circuit die 100 with an active region 110 and a guard ring structure 120 surrounding the active region 110, in accordance with an embodiment of the present disclosure. In some embodiments, the active region 110 includes one or more semiconductor device, such as a transistor, sensor, circuit, or the like. The active region 110 can include active devices, such as transistors and diodes, and/or passive devices, such as capacitors and resistors. The active region 110 can also include contacts, interconnects, and other structural components of the circuit, as will be appreciated. The active region 110 can vary in complexity from a single device to an integrated circuit with thousands of devices (or more).

The present disclosure contemplates the guard ring structure 120 being formed in or including one or more layers of an integrated circuit architecture. For example, the guard ring structure 120 can be formed on a base layer or substrate, formed in a semiconductor material layer common to various semiconductor devices, formed in an inter-layer dielectric (ILD) material layer that is coplanar with or vertically above semiconductor material layers, formed in an interconnect layer, or formed in a metallization layer or via layer vertically above the semiconductor material layer(s), to name a few examples. In one such embodiment, for example, the guard ring structure 120 is formed in a metallization layer and/or a via layer (e.g., ILD material layer) that is vertically above the device material layer(s) and substrate. In other embodiments, for example, the guard ring structure 120 is similar to a moat or wall that surrounds the active region 110 and extends below semiconductor devices and/or extends upward from a base layer or substrate. As such, the guard ring structure 120 can be formed in or include a semiconductor material layer, a base layer, or the substrate, in accordance with some embodiments.

In accordance with some embodiments, the guard ring structure 120 can be considered to surround the active region 110 as viewed in a top-down view (i.e., a top plan view) even if the guard ring structure 120 is not formed in or does not include the material layers used to define devices of the integrated circuit. For example, a guard ring structure 120 is formed in the dielectric material of a metallization or via layer that is vertically above layers of semiconductor material used to form devices on a base layer or substrate. Thus, such a guard ring structure 120 surrounds an active region 110 containing those semiconductor devices when the guard ring structure 120 surrounds or encloses the active region when viewed in a top-down view.

In accordance with an embodiment of the present disclosure, a guard ring structure 120 includes a plurality of concentric guard rings 122 each defining a generally rectangular shape with rounded corners 124. For example, the guard ring 122 has linear sides 126A-126D arranged to define a rectangular shape, where adjacent linear sides 126 extend generally perpendicularly to each other and are joined by rounded corners 124. Opposite linear sides 126A and 126C are generally parallel (e.g., ±5°) and opposite linear sides 126B and 126D are also generally parallel (e.g., ±5°). In one example embodiment, each rounded corner 124 spans 90 degrees and joins adjacent linear sides 126 that are oriented perpendicularly to each other. In some embodiments, the rounded corners 124 include curves or arcs that span from 85 to 95 degrees, such as from 88 to 92 degrees, from 89 to 91 degrees, or 90 degrees. In some embodiments, the rounded corners 124 include a combination of curves and lines that together generally define a rounded corner 124 joining adjacent linear sides 126 in a single, continuous path.

The concentric guard rings 122 have a guard ring pitch 128 of 80 nm or less, including 70 nm or less, 60 nm or less, 50 nm or less, 40 nm or less, 30 nm or less, 20 nm or less, 10-30 nm, 20-40 nm, 20-60 nm, 30-50 nm, 30-70 nm, 40-60 nm, 40-80 nm, 50-70 nm, 50-80 nm, and 60-80 nm. The guard ring pitch 128 can be defined, for example, as the distance between corresponding portions of concentric guard rings 122, as will be appreciated. For example, the guard ring pitch 128 is the distance between the centers of the linear sided 126A of adjacent guard rings 122. The guard ring pitch 128 is the same as the DSA pitch, in accordance with some embodiments.

In one embodiment, the guard ring structure 120 includes a plurality of sound groups 130 of n guard rings 122 surrounding the active region 110. Each guard ring 122 of a sound group 130 defines a distinct, closed rectangular loop with rounded corners 124. For example, the closed rectangular loop follows a single, closed path that does not split, turn on itself, or join with other guard rings or portions or guard rings. As such, the guard rings 122 of the sound groups 130 are free or substantially free of defects 154. The guard ring structure 120 also includes flawed groups 150 of m guard rings 122 that include defects 154 in a corner region. The flawed groups 150 of guard rings 122 (with defects 154) are interspersed in a concentric arrangement with the sound groups 130 of guard rings 120 (without defects 154). Sound groups 130 of guard rings 122 are illustrated in the figures in solid lines and flawed groups 150 of guard rings 122 are illustrated in broken lines for clarity of illustration; however, spaces in the broken lines are not intended to convey breaks in the structure, but rather to visually distinguish guard rings 122 of the sound groups 130 from guard rings 122 of the flawed groups 150.

In one embodiment, the guard ring structure 120 includes at least a first sound group 130a and a second sound group 130b of guard rings 122. The first sound group 130a includes at least one guard ring 122, such as 2-10 guard rings 122. A second sound group 130b of guard rings 122 is greater in size than and surrounds the first sound group 130a of guard rings 122. The second sound group 130b also has at least one guard ring 122, such as 2-10 guard rings 122. In some embodiments, the first and second sound groups 130a, 130b have the same number of guard rings 122. Each guard ring 122 of the first sound group 130a and the second sound group 130b defines a closed rectangular loop that is distinct from an adjacent guard ring 122 of the guard ring structure 120. The first sound group 130a and the second sound group 130b lack defects 154 giving rise to a break in continuity.

For example, the guard rings 122 of the sound groups 130 lack dislocations, disclinations, or loops formed at corners 124.

A flawed group 150 of guard rings is concentric with and located radially between the first sound group 130a and the second sound group 130b of guard rings 122. The flawed group 150 includes at least one guard ring 122, such as 2-10 guard rings 122. The flawed group 150 defines four corner regions 152, where each corner region 152 includes the corners 124 of all guard rings 122 in the flawed group 150. Each of the four corner regions 152 includes one or more defect 154 located between corners 124 of the first sound group 130a and corners 124 of the second sound group 130b of guard rings 122. For example, the defect(s) 154 can be found on or closely adjacent a diagonal 156 between the first sound group 130a and the second sound group 130b. As shown in FIG. 1, for example, one or more defects 154 occurs in every corner region 152 between the first sound group 130 and the second sound group 140, in accordance with some embodiments.

A guard ring defect 154 can be a dislocation 154a (e.g., a break or discontinuity), a disclination 154b (e.g., multiple paths merge or connect), a loop defect 154c (e.g., a loop, hook, or eyelet), or some other defect that is a deviation from a distinct, single path defining a closed, generally rectangular shape, as will be appreciated. An example of a loop defect 154c is a closed or mostly closed shape that is located wholly outside of the active region 110 and does not enclose the active region 110. The loop defect 154c typically has a dimension (e.g., diameter, width, etc.) consistent with the DSA pitch (e.g., ~30 nm). The loop defect 154c can be defined in part by a complete guard ring 122 or a portion of a guard ring 122.

In some embodiments, the guard ring structure 120 includes a third sound group 130c of guard rings 122, where the third sound group 130c has the same number of guard rings 122 as the first sound group 130a and the second sound group 130b. Guard rings 122 of the third sound group 130c are greater in size than those of the second sound group 130b and surround the second sound group 130b in a concentric arrangement. Similarly, the guard ring structure 120 includes a second flawed group 150b of guard rings 122 concentric with and located radially between the second sound group 130b and the third sound group 130c. In such embodiments, the second flawed group 150b of guard rings 122 defines corner regions 152 that each include at least one defect 154 between corners 124 of the second sound group 130b of guard rings 122 and corners 124 of the third sound group 130c of guard rings 122. In some such embodiments, the guard ring structure 120 exhibits a repeating pattern of sound groups 130 of distinct, closed guard rings 122 interspersed with flawed groups 150 exhibiting one or more defect 154 at every corner region 152.

When inspected along one of the diagonals 156 of the rectangular shape, for example, the guard ring structure 120 exhibits a repeating pattern of defect-free groups of corners 124 interspersed with groups of corners 124 containing defects, in accordance with an embodiment of the present disclosure. For example, the repeating pattern includes alternating sound groups 130 of n corners 124 without defects, and flawed groups 150 of m corners 124 containing defects 154, where n and m have a consistent value from 1 to 10 among the sound groups 130 and flawed groups 150, respectively. In one particular example, the repeating pattern includes sound groups 130 of three consecutive corners 124 without defects 154 alternating with flawed groups 150 of four consecutive corners 124 containing one or more defect 154. In some embodiments, the one or more defect 154 may be randomly located among the four consecutive corners 124 in the flawed group 150.

In some embodiments, the guard ring pitch 128 is consistent across and between the first sound group 130a, the second sound group 130b, and the flawed group 150, except where defects 154 are found in the corner regions. When present, the guard ring pitch 128 is also consistent across and between the third sound group 130c and second flawed group 150b of guard rings 122. More generally, the guard ring pitch 128 is consistent at the linear sides 126 within and between all n sound groups 130 of guard rings 122 and all m interspersed flawed groups 150 with defects 154, in accordance with some embodiments.

In some embodiments, the corners 124 of each of the n sound groups 130 of guard rings 122 exhibit an increase in the radius of curvature moving along the diagonal 156 from the radially innermost guard ring 122a to the radially outermost guard ring 122c of the group. The corner 124 of a radially intermediate guard ring 122c between the radially innermost 122a and radially outermost guard rings 122c has an intermediate value for the radius of curvature. The sound group 130 of guard rings 122 can have more than one radially intermediate guard ring 122b. In some such embodiments, the values of the radius of curvature increase from the radially innermost guard ring 122a to the radially outermost guard ring 122c with the same values for each of the sound groups 130. For example, the values of the radii of curvature in each sound group 130 of guard rings 122 are the same (within a range of error) from the radially innermost guard ring 122a to the radially outermost guard ring 122c.

In one example, each sound group 130 has three guard rings 122. The corners 124 of the radially innermost guard ring 122a have a first radius of curvature of 15 nm, the corners 124 of the radially intermediate guard ring 122b have a second radius of curvature of 30 nm, and the corners of the radially outermost guard ring 122c have a third radius of curvature of 45 nm. In an example, the values for the radius of curvature have an acceptable error of ±5 nm or other suitable error range, as will be appreciated. That is, for example, each sound group 130 has a first radius of curvature from 10 to 20 nm, a second radius of curvature from 25 to 35 nm, and a third radius of curvature from 40 to 50 nm. When moving along a diagonal 156 radially outward, the radius of curvature "resets" to the first radius of curvature at the radially innermost guard ring 122 of each of the n sound groups 130 of guard rings 122.

In accordance with another embodiment, the guard ring structure 120 has a plurality of sound groups 130 of guard rings 122. Each sound group 130 has a series of n concentric guard rings 122 increasing in size from a radially innermost guard ring 122a to a radially outermost guard ring 122c. The corners 124 in each sound group 130 have a radius of curvature that similarly increases from a first radius of curvature $R_1$ for corners 124 of the radially innermost guard ring 122a to an nth radius of curvature $R_n$ for corners 124 of the nth guard ring 122 (e.g., the radially outermost guard ring 122c) of the sound group 130. Each sound group 130 has the same number, n, of guard rings 122. In the case where n=1, each sound group 130 has one guard ring 122 and one radius of curvature. The value of n can have other whole, positive values, such as 2, 3, 4, 5, 6, 7, 8, 9, 10, etc. The number of guard rings 122 in each sound group 130 may depend to some extent on the DSA pitch of the block copolymer solution and the pinning stripe pitch, as will be appreciated.

In some embodiments, the radius of curvature approximates an arc joining adjacent linear sides 126 of the rectangular shape even though the actual shape of the corner 124 may be a combination of curves and linear sections, for example. In other embodiments, the corner 124 closely follows a curve that is not a true arc, but nonetheless has an arcuate shape. In some such embodiments, the radius of curvature is an average radius of curvature along the curve between adjacent linear sides 126. In yet other embodiments, the corner 124 follows an arc with a single radius of curvature.

Figure 2:
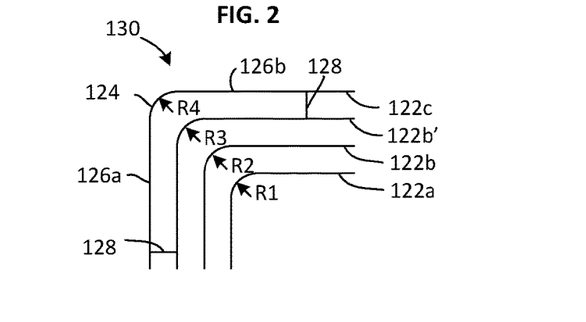
FIG. 2 illustrates a top plan view of part of a guard ring structure showing an increase in the radius of curvature from a radially innermost guard ring to a radially outermost guard ring of a sound group of guard rings, in accordance with an embodiment of the present disclosure.

Referring now to FIG. 2, a top plan view shows a portion of a sound group 130 of guard rings 122 in accordance with an embodiment of the present disclosure. Each guard ring 122 has a first linear side 126a that is oriented substantially perpendicularly (e.g., ±5°) to a second linear side 126b. The first linear side 126a is joined to the second linear side 126b by a rounded corner 124 with a radius of curvature R. The linear sides 126 are spaced according to the guard ring pitch 128. The radially innermost guard ring 122a has first radius of curvature R1, a radially intermediate guard ring 122b has a second radius of curvature R2, another radially intermediate guard ring 122b' has a third radius of curvature R3, and the radially outermost guard ring 122c has a fourth radius of curvature R4. In some embodiments, the radius of curvature increases by the guard ring pitch 128 from one corner 124 to the next larger corner 124. In some embodiments, the first radius of curvature R1 is a whole-number multiple of the guard ring pitch 128 (e.g., 1× or 2×).

Figure 3:
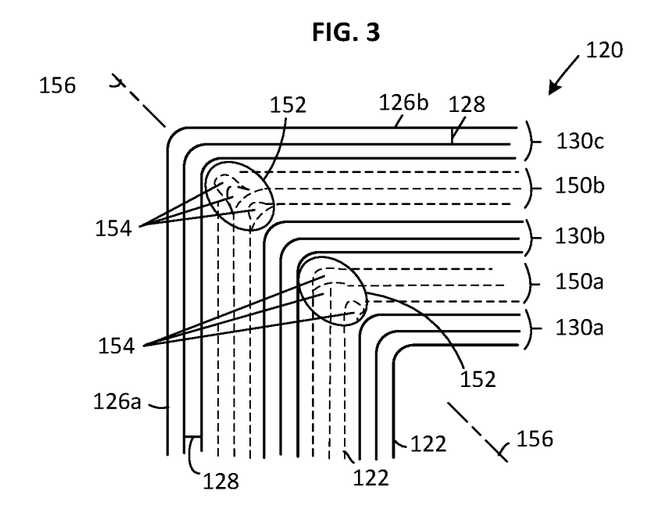
FIG. 3 illustrates a top plan view of part of a guard ring structure that includes sound groups of guard rings (with no defects or with otherwise negligible defects) and flawed groups of guard rings interspersed with the sound groups, where each corner region of the flawed groups includes at least one material defect, in accordance with an embodiment of the present disclosure.

FIG. 3 is a top plan view illustrating a corner portion of a guard ring structure 120 that includes a first sound group 130a, second sound group 130b, and a third sound group 130c of guard rings 122, in accordance with an embodiment of the present disclosure. Flawed groups 150 are interspersed with the sound groups 130, where the flawed groups 150 contain defects 154 at every corner region 152. Guard rings 122 of the first sound group 130a, second sound group 130b, and third sound group 130c are free of defects 154, while the corner region 152 of the first flawed group 150a between the first and second sound groups 130a, 130b, and the corner region 152 of the second flawed group 150b between the second and third sound groups 140, 160, contain at least one defect 154. The linear sides 126a, 126b of the guard rings 122 in sound groups 130 and flawed groups 150 have a consistent guard ring pitch 128. As illustrated, each of the first, second, and third sound groups 130a, 130b, 130c have three guard rings 122, each of which is distinct from an adjacent guard ring 122. In each case, for example, when moving radially outward along the diagonal 156, the fourth guard ring 122 in the series (i.e., first guard ring of a flawed group 150) contains a defect 154.

Figure 4:
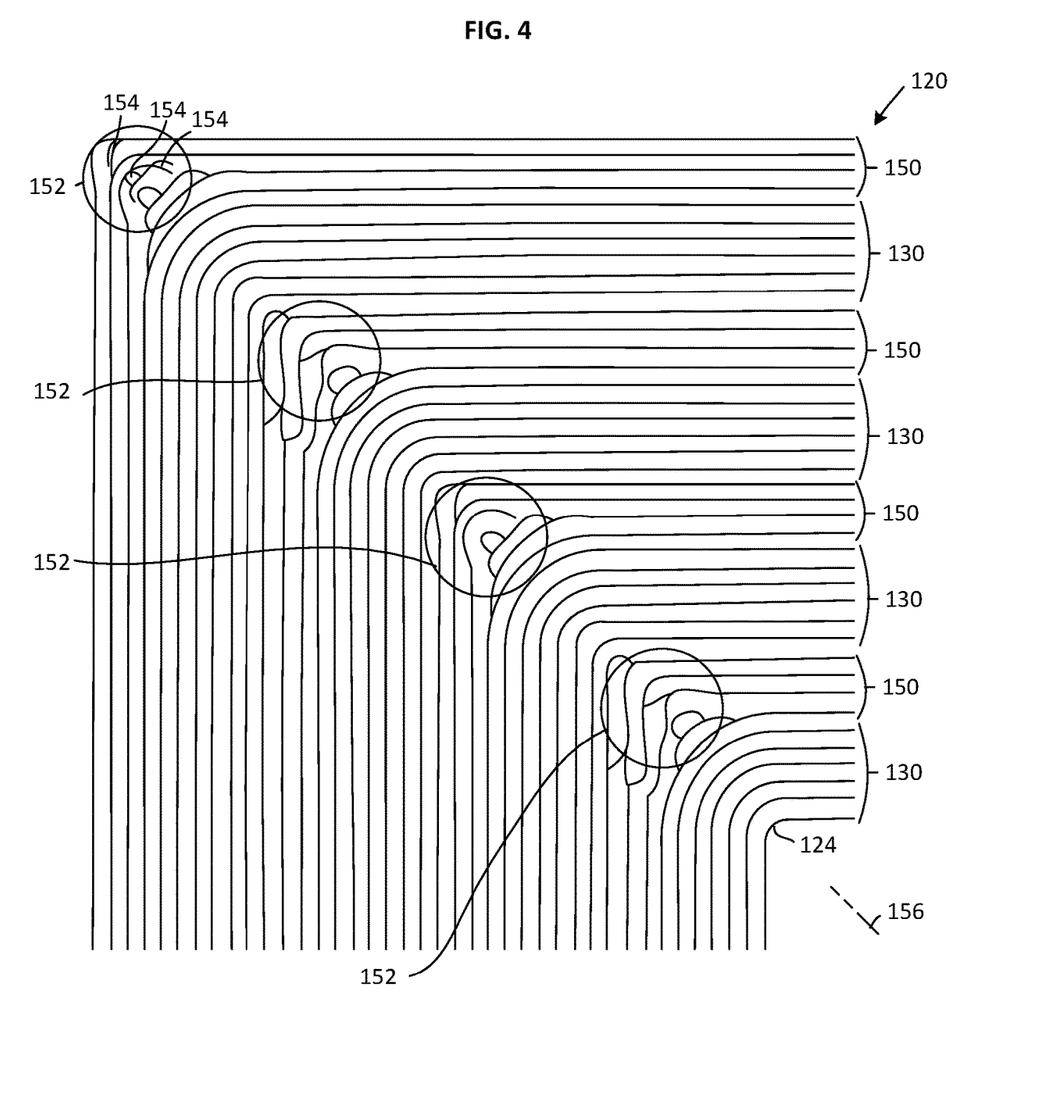
FIG. 4 illustrates a top plan view of part of a guard ring structure with defects appearing periodically in corner regions of the structure, and having a repeating pattern of increasing radii of curvature for corners of the defect-free guard rings, in accordance with an embodiment of the present disclosure.

Referring now to FIG. 4, a top plan view illustrates part of another example of a guard ring structure 120, in accordance with an embodiment of the present disclosure. In this example, the guard ring pitch is about 30 nm and each sound group 130 of guard rings 122 has five guard rings 122 with rounded corners 124 that lack defects. In one example embodiment, each sound group 130 has a first radius of curvature of 50 nm, a second radius of curvature of 75 nm, a third radius of curvature of 100 nm, a fourth radius of curvature of 125 nm, and a fifth radius of curvature of 150 nm, with an error of about ±5 nm. As shown in FIG. 4, each flawed group 150 includes four guard rings 122 and has several defects 154 in every corner region 152. The guard ring structure 120 has a pattern along the diagonal 156 of an alternating series of five consecutive rounded corners 124 without defects and a series of four guard rings with one or more defects 154 at the corner region 152. Although four sound groups 130 and four flawed groups 150 are illustrated, the pattern of defects 154 and lack of defects 154 along the diagonal 156 will continue with additional sound groups 130 and flawed groups 150, as will be appreciated.

Figure 5:
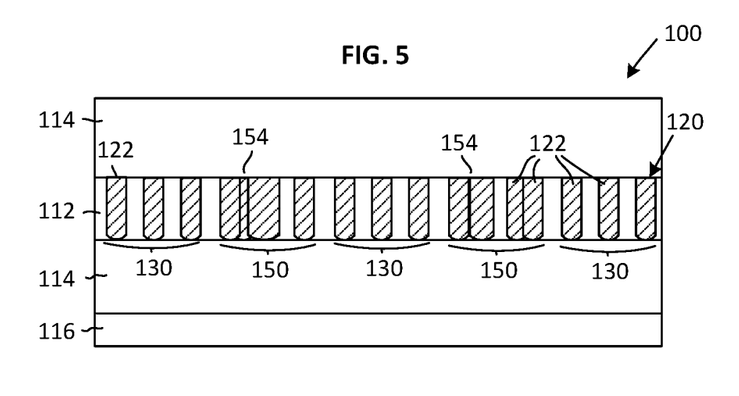
FIG. 5 illustrates a cross-sectional view taken along a diagonal of a guard ring structure, showing sound groups of guard rings alternating with flawed groups of guard rings, in accordance with an embodiment of the present disclosure.

Referring now to FIG. 5, a cross sectional view of a die 100 taken through a diagonal of a guard ring structure 120 shows an example of sound groups 130 of guard rings 122 without defects interspersed with flawed groups 150 of guard rings 122 with defects 154, in accordance with an embodiment of the present disclosure. In this example, the guard ring structure 120 is formed in a via layer 112 between metallization layers 114, each of which is located vertically above a semiconductor material layer 116. Additional material layers may exist above or below the layers shown in FIG. 5. The via layer 112 and metallization layers 114 each comprise a dielectric material, such as silicon dioxide ($SiO_2$) titanium nitride (TiN), silicon nitride ($Si_3N_4$) or other suitable dielectric material. The guard rings 122 comprise a metal, such as aluminum, copper, titanium, or other suitable metal. The sound groups 130 each have three guard rings 122 and exhibit consistent spacing between adjacent guard rings 122 as well as consistent cross-sectional lateral thickness. In this example, the gap between adjacent guard rings 122 is substantially the same as the lateral thickness of the guard rings 122. The flawed groups 150 exhibit irregular spacing and inconsistent lateral thickness, features which indicate defects 154 in the guard ring structure 120.

Figure 6:
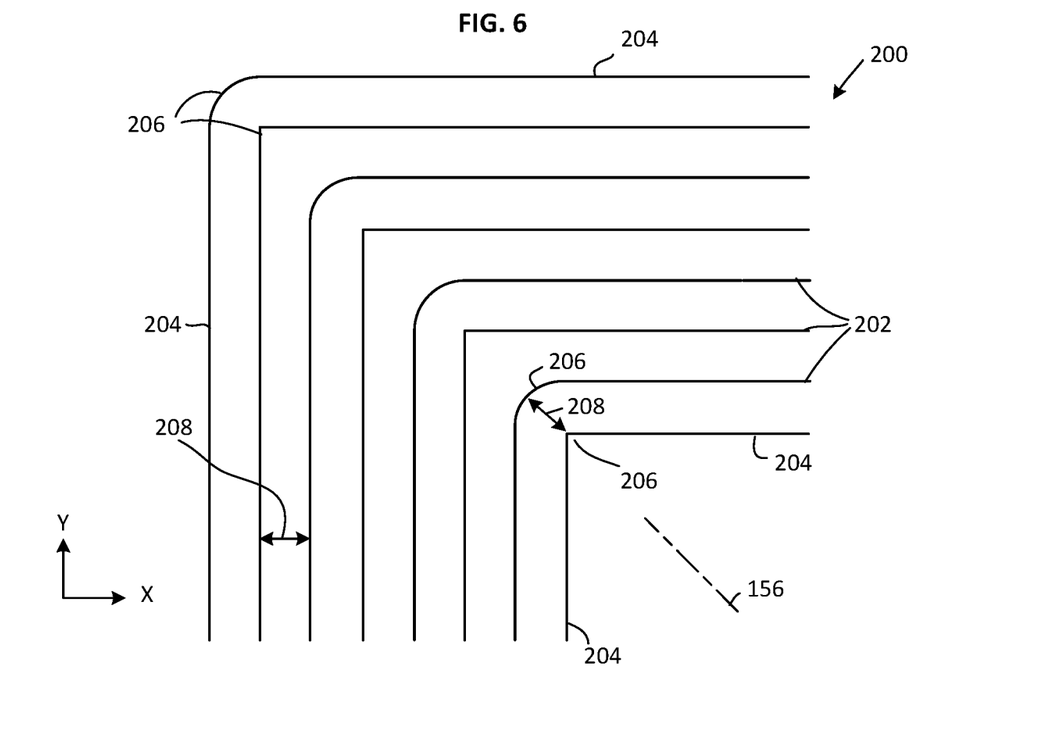
FIG. 6 is a top plan illustration of a part of a pinning stripe structure showing corners of the pinning stripes alternating along the diagonal between an L-shape and a rounded shape, in accordance with an embodiment of the present disclosure.

Referring now to FIG. 6, a top plan view illustrates a corner portion of a pinning stripe structure 200 in accordance with an embodiment of the present disclosure. The pinning stripe structure 200 includes a plurality of pinning stripes 202 that define the outline of a generally rectangular shape. The rectangular shape includes linear portions 204 joined by a stripe corner 206. The linear portions 204 have a pinning stripe pitch 208 that is a multiple of a DSA pitch 128. The pinning strip pitch 208 is greater than 80 nm. For example, when the DSA pitch is 22 nm, the pinning stripe pitch 208 is 88 nm. In one embodiment, the pinning stripes 202 are made of photoresist and can have a line width equal to half the pining stripe pitch 208. Along a diagonal 156, the stripe corners 206 alternate between a right angle and an arcuate shape. In such a configuration, the distance between the outside of the right-angle stripe corner 206 and the inside of the rounded stripe corner 206 is substantially equal to the pinning stripe pitch 208. As a result, the block copolymers of the DSA solution can form a rounded corner without defects through this region due to maintaining the DSA pitch. The result is that the block copolymers do not form defects in this region. In contrast, the distance from the outside of the rounded stripe corner 206 to the inside of the right-angle corner 206 deviates from the pinning stripe pitch 208 and is inconsistent around the corner 206. Accordingly, the block copolymers do not align to the guide line of the pinning stripes 202 in this region and form one or more defects.

In one example pinning stripe structure 200, the pinning stripe pitch 208 is 150 nm for a DSA pitch 128 of 30 nm. Each rounded stripe corner 206 has a radius of curvature of about 150 nm. The diagonal distance from the outside of a right-angle stripe corner 206 to the inside of a rounded stripe corner 206 is about 150 nm. In contrast, the diagonal distance from the outside of a rounded stripe corner 206 to the inside of a right-angle corner 206 is about 280 nm. As the DSA molecules align around the corner in the region, the larger distance at the corner allows the DSA molecules to form random shapes (i.e., defects).

Figure 7:
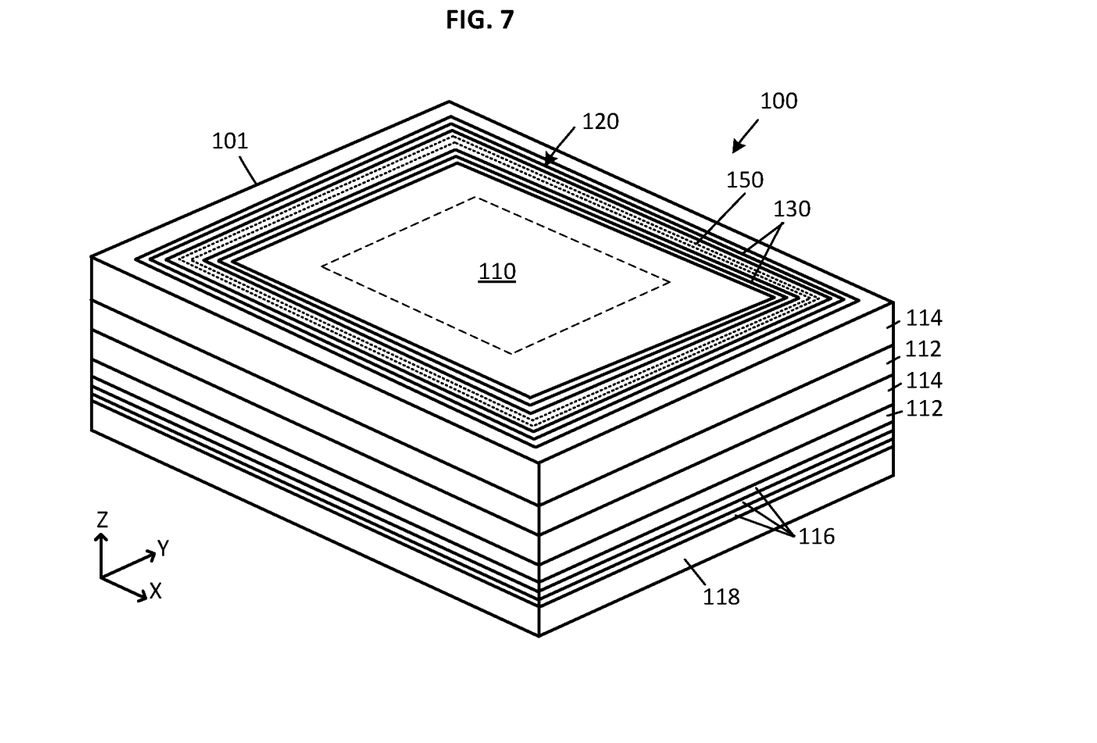
FIG. 7 is a perspective illustration of an integrated circuit die showing various material layers, an active region, and a guard ring structure formed in a metallization layer, in accordance with an embodiment of the present disclosure.

Referring now to FIG. 7, a perspective view illustrates a die 100 with a guard ring structure 120 formed in accordance with an embodiment of the present disclosure. The die 100 includes an active region 110 that can include one or more semiconductor devices. For example, the active region 110 includes devices formed in semiconductor material layers 116 and/or base 118. The active region 110 can include metal interconnects and contacts that extend from a metallization layer 114 to one or more of the semiconductor material layers 116. The base 118 can be, for example, a bulk semiconductor wafer (e.g., silicon) or a substrate material (e.g., sapphire). Via layers 112 and metallization layers 114 are formed on top of the semiconductor material layers 116 and generally include a dielectric material. Numerous variations and embodiments will be apparent in light of the present disclosure.

The substrate 101 in some embodiments, may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the base 118 is a bulk wafer, such as monocrystalline silicon, germanium, silicon carbide (SiC), gallium nitride (GaN), and gallium arsenide (GaAs) to name a few examples. The semiconductor material can be selected in some embodiments from group III-V materials and/or group IV materials. Further, the substrate 101 can comprise a semiconductor layer deposited or grown on, or transferred to, a structural base 118, such as silicon carbide layer epitaxially grown on a sapphire base. Substrate 105, in some embodiments may include a semiconductor on insulator (SOI) structure where an insulator/dielectric material (e.g., an oxide material, such as silicon dioxide) is sandwiched between two semiconductor material layers 116, such as in a buried oxide (BOX) structure. For example, in some such embodiments the SOI structure includes a silicon dioxide layer on a bulk silicon wafer (e.g., base 118), and atop layer on the silicon dioxide layer is monocrystalline silicon. As will be appreciated, the thickness of the semiconductor substrate (or the semiconductor material layer(s) 116 of the substrate 101, as the case may be) can be any thickness suitable for devices to be fabricated thereon.

In one example embodiment as shown in FIG. 7, the guard ring structure 120 is formed in an upper one of the metallization layers 114. In some embodiments, the guard ring structure 120 extends vertically through the metallization layer 114 and terminates in the via layer 112 below it. In other embodiments, the guard ring structure 120 can be formed in a lower metallization layer 114, in a via layer 112, in a semiconductor material layer 116, in the base 118, or in a combination of these layers. In some embodiments, the guard ring structure 120 is contained within a single layer. In other embodiments, the guard ring structure 120 is formed in a plurality of layers and can extend vertically through one or more layers. In yet other embodiments, the guard ring structure 120 is formed primarily in one layer and extends part way into a layer below where it terminates. As a whole, the base 118, semiconductor material layers 116, via layers 112 and metallization layers 114 (or a subset thereof) can be considered a substrate 101 for purposes of forming the guard ring structure 120. Similarly, such material layers in wafer form, rather than die form, can serve as the substrate 101 in some embodiments. The substrate 101 can include additional material layers or fewer layers, as will be appreciated. Sound groups 130 of guard rings 122 are illustrated in solid lines and a flawed group 150 of guard rings 122 is illustrated in broken lines for clarity of illustration; however, spaces in the broken lines used in FIG. 7 are not intended to convey breaks in the structure, but rather to aid in visually distinguishing sound groups 130 from the flawed group 150.

Figure 8:
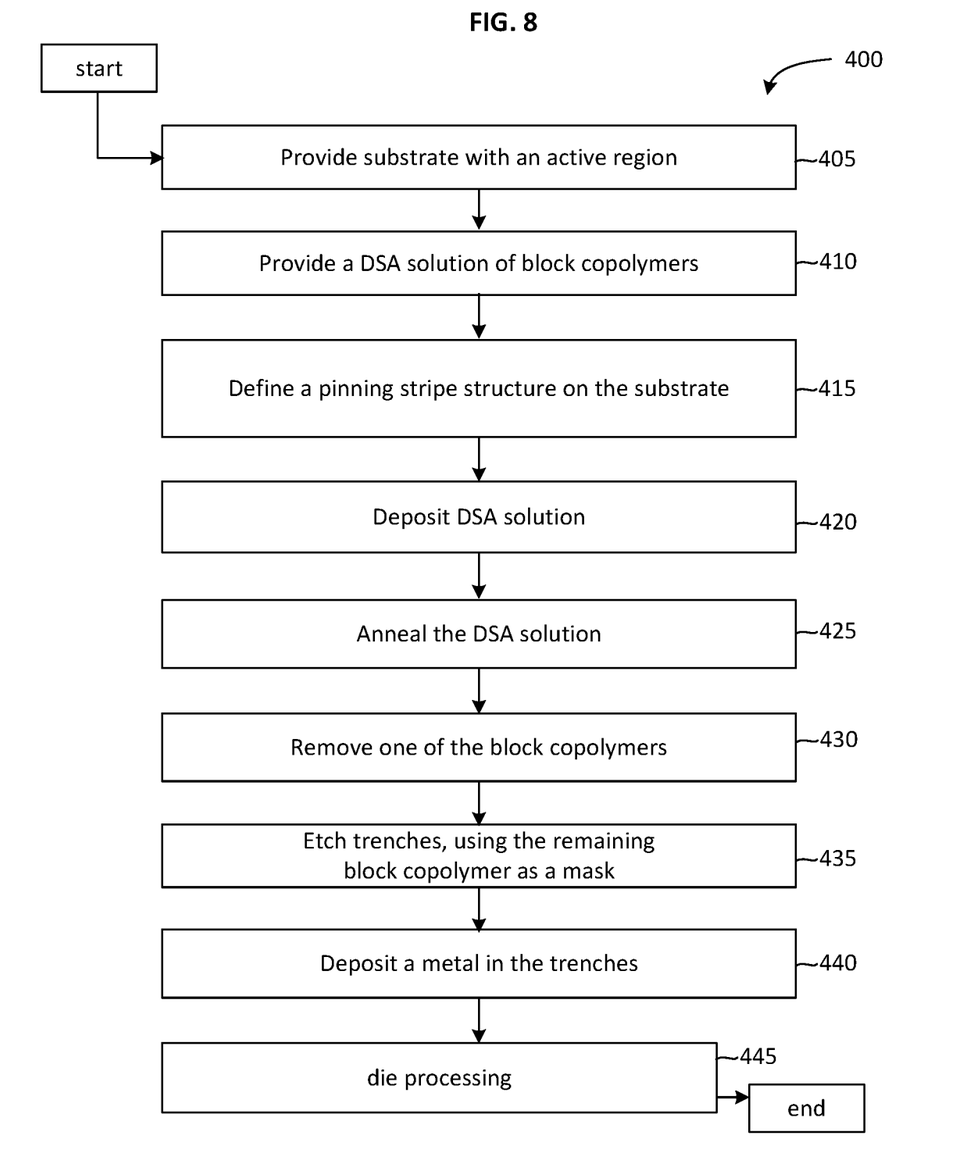
FIG. 8 is a flow chart showing processes in a method of forming a guard ring structure, in accordance with some embodiments of the present disclosure.

Referring now to FIG. 8, a flowchart illustrates processes in a method 400 of forming a guard ring structure for an integrated circuit, in accordance with an embodiment of the present disclosure. In accordance with some embodiments, method 400 advantageously requires minimal, if any, changes to the design of other layers above and below the DSA layer.

In an embodiment, method 400 begins with providing 405 a substrate with one or more active region. For example, the substrate can be a semiconductor wafer with a plurality of active regions distributed across the wafer in a grid, each active region containing devices, integrated circuits, and/or sensors. In another example, the substrate comprises a semiconductor layer with at least one active region containing one or more semiconductor device. Lamellae-forming block copolymers are provided 410 for directed self-alignment (DSA). For example, the block copolymers are polystyrene and polymethyl methacrylate (PS-b-PMMA) in a solvent or carrier liquid. In one example, annealing the block copolymers solution causes molecules of the DSA copolymer solution self-align to form alternating lines of polystyrene and polymethyl methacrylate. In some embodiments, the alternating lines of polymers have a DSA pitch from about 15 nm to about 30 nm. In some embodiments, the lines of polymers have a DSA pitch of 22 nm, 25 nm, or 27 nm. Numerous other suitable DSA solutions can be used, as will be appreciated.

Method 400 continues with defining 415 a pinning stripe structure on the substrate. In one embodiment, the pining stripe structure includes lines of photoresist that define concentric rectangles around the active region(s). The linear sections of the rectangles have a line spacing or pinning stripe pitch that is a multiple of the DSA pitch. For example, when the DSA pitch is 30 nm, the pinning stripe structure has a pinning stripe pitch of 90 nm, 120 nm, 150 nm, or other whole-number multiple of the DSA pitch. In some embodiments, the pinning stripes are formed using photoresist, which can resolve features down to about 90-100 nm.

The pinning stripe structure can be formed using any suitable wet or dry photolithography techniques, as will be appreciated. In one example process, photoresist is spin-coated onto the substrate, a mask is used during exposure to ultraviolet light to polymerize certain regions of the photoresist, and the non-polymerized regions of photoresist are removed with a solvent. The lithographic process leaves spaced-apart lines of photoresist on the substrate in a pattern that can be used to guide alignment of molecules of the block copolymer solution. When lines of the pinning stripe structure are spaced by a multiple of the DSA pitch, the block copolymers align consistently to the pinning stripe structure.

In some embodiments, the rectangles have linear sections joined at corners that form either a right angle or an arc. In one such embodiment, the corners of the rectangles alternate between right angles (or L-shape) and rounded corners when moving radially outward along a diagonal of the inning stripe structure. For example, the first corner is a right angle, the second corner is a rounded corner, the third is a right angle, and so forth. As discussed above with reference to FIG. 6, for example, the diagonal distance from the outside of the right-angle corner to the inside of the rounded corner of the next larger rectangle is substantially equal to a whole-number multiple of the DSA pitch (or a whole-number multiple of the acceptable range of DSA pitch). Accordingly, the block copolymers can align to define a rounded corner between the outside of the right-angle corner and the inside of the rounded corner with lines that are within an acceptable range of DSA pitch (e.g., 18 to 27 nm). Since the DSA pitch is satisfied in this region, the corners formed by the block copolymers are without defects. In contrast, the distance from the outside of the rounded corner to the inside of the right-angle corner of the next larger rectangle is greater than the pinning stripe pitch and also deviates from a whole-number multiple of the DSA pitch. In these regions, the block copolymers seek to align in a shape satisfying the DSA pitch. Since the diagonal spacing is not a multiple of the DSA pitch, defects form in this region.

Method 400 continues with depositing 420 the block copolymer DSA solution on the substrate and pinning stripe structure. In some embodiments, the DSA solution is spin coated onto the substrate. In other embodiments, the DSA solution is sprayed, sputtered, dripped, or otherwise applied to the substrate.

Method 400 continues with annealing 425 the DSA solution. For example, a PS-b-PMMA block copolymer solution can be annealed using a solvent vapor annealing (SVA) process with acetone, tetrahydrofuran (THF), or other suitable solvent. In another example, the PS-b-PMMA block copolymer solution can be annealed by heating at a temperature sufficient to vaporize the solvent, such as about 170° C. to about 230° C. During the annealing 425 process, the molecules of the block copolymers align along the pinning stripe structure to define alternating lines of the block copolymers. Along linear regions of the rectangles, for example, the polymers consistently define alternating parallel lines of a first polymer (e.g., polystyrene) and a second polymer (e.g., polymethyl methacrylate (PMMA)). Between the outside of a right-angle corner and the inside of a rounded corner of the pinning stripe structure, the polymers form rounded corners without defects since the pitch in this region is commensurate with the DSA pitch. In regions between the outside of the rounded corner and the inside of the right-angle corner, the block copolymers form one or more defects since the distance between the corners is incommensurate with the DSA pitch. Thus, defects in the lines of the block copolymers are intentionally formed in corner regions between the outside of a rounded corner and the inside of a right-angle corner of the pinning stripe structure.

Method 400 continues with removing 430 one of the block copolymers. For example, a suitable solvent is selected to remove the first block copolymers (e.g., polystyrene) and leave the second block copolymer (e.g., polymethyl methacrylate) on the substrate. The second block copolymer can be used as a mask for subsequent processing.

Method 400 continues with etching 435 trenches in the material previously covered by the first copolymer. In one embodiment, the block copolymer solution is applied on a dielectric material of a via layer or a metallization layer, such as silicon dioxide or titanium nitride. The guard ring trenches can be formed using any suitable wet or dry etching process, as will be appreciated.

Method 400 continues with depositing 440 a metal, semiconductor, or other material in the etched trenches and planarizing as needed to define the guard rings of the guard ring structure. In one embodiment where the guard ring structure is formed in a via layer or metallization layer, copper, aluminum, titanium, or other conductive metal is deposited. In other embodiments in which the guard ring structure is formed in one or more semiconductor material layers, a doped semiconductor material can be deposited in the trench. For example, n-type semiconductor material is deposited into trenches formed in a p-type semiconductor material layer, or vice versa. Numerous variations and embodiments will be apparent in light of the present disclosure. Subsequent additional die processing may be performed, including packaging processes.

In some embodiments, method 400 can be performed during or after back-end or back-end-of-line (BEOL) processing, for example. For example, the guard ring structure can be formed during or after processing for metallization or interconnects, as will be appreciated. In other embodiments, method 400 can be performed in a front-end-of-line (FEOL) processing, such as after or during formation of semiconductor devices, as will be appreciated. Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Example System

Figure 9:
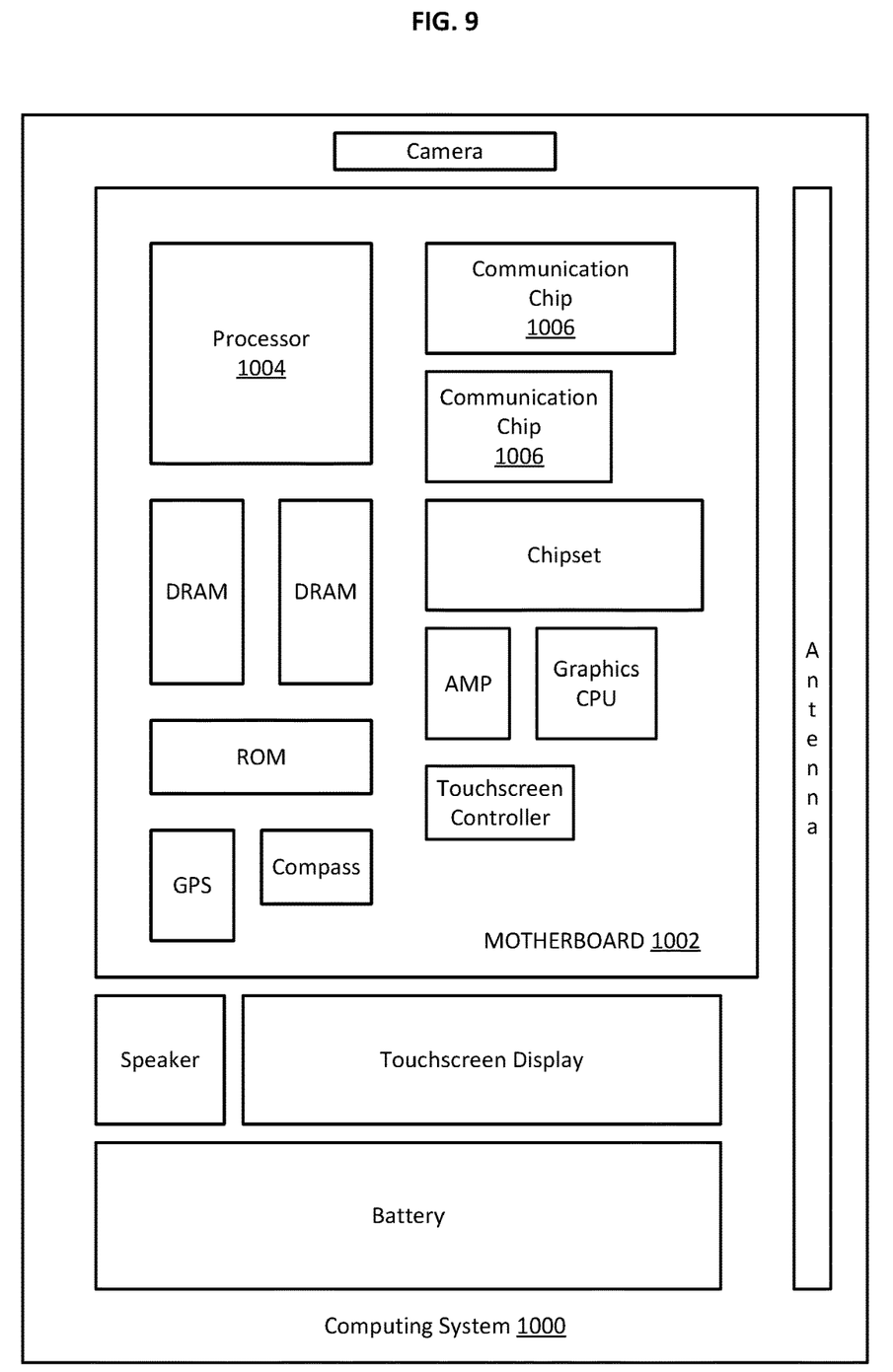
FIG. 9 illustrates an example computing system including integrated circuits that include a guard ring structure formed in accordance with some embodiments of the present disclosure.

FIG. 9 illustrates an example computing system 1000 including integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more guard ring structures formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures, devices, or guard ring structure formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuits or devices with a guard ring structure formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit die comprising: an active area including one or more semiconductor devices; a first guard ring surrounding the active area, the first guard ring defining a distinct, closed rectangular loop with rounded corners; a second guard ring concentric with and encompassing the first guard ring, wherein the second guard ring defines a distinct, closed rectangular loop with rounded corners; and a third guard ring concentrically arranged between the first guard ring and the second guard ring, the third guard ring defining a generally rectangular shape and having a defect at a corner region between the rounded corners of the first guard ring and the second guard ring.

Example 2 includes the subject matter of Example 1, wherein the defect at the corner region is part of a plurality of defects that includes a defect at every corner region of the third guard ring between the first guard ring and second guard ring.

Example 3 includes the subject matter of Example 2, wherein the plurality of defects includes dislocations and/or disclinations.

Example 4 includes the subject matter of any of Examples 1-3, wherein the defect includes a break in continuity.

Example 5 includes the subject matter of any of Examples 1-4, wherein the first guard ring, the second guard ring, and third guard ring are located at least in part in a metallization layer vertically above the semiconductor device, wherein the first guard ring, the second guard ring, and the third guard ring encompass but do not overlap the active area as viewed from above.

Example 6 includes the subject matter of any of Examples 1-4, wherein the first guard ring, the second guard ring, and third guard ring are located at least in part in a via layer vertically above the semiconductor device.

Example 7 includes the subject matter of any of Examples 1-7, wherein the first guard ring and the second guard ring comprise a metal.

Example 8 includes the subject matter of any of Examples 1-8, wherein the first guard ring is part of a first plurality of guard rings, and the second guard ring is part of a second plurality of guard rings, and each of the first and second pluralities includes at least three concentric guard rings.

Example 9 includes the subject matter of Example 8, wherein the first plurality of guard rings and the second plurality of guard rings have a pitch of 40 nm or less.

Example 10 includes the subject matter of any of Examples 1-9, wherein the first guard ring and the second guard ring are free of the defect of the third guard ring.

Example 11 is a guard ring structure for an integrated circuit, the guard ring structure comprising: a first group of n concentric guard rings surrounding an active region of an integrated circuit, then concentric guard rings of the first group having a guard ring pitch of less than 80 nm, wherein each of the n concentric guard rings of the first group has a single closed path distinct from an adjacent guard ring and defines a rectangular geometry with rounded corners; a second group of n concentric guard rings surrounding the active region of the integrated circuit, the n concentric guard rings of the second group encompassing the first group and having the guard ring pitch of less than 80 nm, wherein each of the n concentric guard rings of the second group has a single closed path distinct from an adjacent guard ring and defines a rectangular geometry with rounded corners; and a third group of m concentric guard rings surrounding the active region of the integrated circuit, the third group between the first and second groups, wherein a corner region of one or more of the m concentric guard rings includes a guard ring defect.

Example 12 includes the subject matter of Example 11, wherein each of n and m is from 2 to 10.

Example 13 includes the subject matter of Example 11, wherein each of n and m is from 4 to 7.

Example 14 includes the subject matter of any of Examples 11-13, wherein then concentric guard rings are free of the guard ring defect included in the m concentric guard rings.

Example 15 includes the subject matter of any of Examples 11-14, wherein each of the first and second groups of n concentric guard rings includes a first guard ring and a second guard ring encompassing the first guard ring; and wherein the rounded corners of the first guard ring have a first radius of curvature and the rounded corners of the second guard ring have a second radius of curvature greater than the first radius of curvature, the first radius of curvature and the second radius of curvature being substantially equal for each of the first and second groups.

Example 16 includes the subject matter of Example 15, wherein each series of n concentric guard rings includes a third guard ring larger than the second guard ring, and rounded corners of the third guard ring have a third radius of curvature greater than the second radius of curvature; wherein the first radius of curvature, the second radius of curvature, and the third radius of curvature are substantially equal for each of the first and second groups.

Example 17 includes the subject matter of Example 16, wherein the first radius of curvature is from 40 to 60 nm, the second radius of curvature is from 65 to 85 nm, and the third radius of curvature is from 90 to 110 nm.

Example 18 includes the subject matter of Example 11, wherein n is at least two and each of the first and second groups of n concentric guard rings includes a radially innermost guard ring and a radially outermost guard ring; wherein a radius of curvature for the rounded corners increases from a first radius of curvature for the radially innermost guard ring to an nth radius of curvature for the radially outermost guard ring, the first radius of curvature and the nth radius of curvature being substantially equal for each of the first and second groups.

Example 19 is a method of forming a guard ring structure, the method comprising: forming a plurality of concentric pinning stripes on a substrate, wherein each of the pinning stripes defines a closed rectangular geometry around an integrated circuit, and wherein the corners alternate between an L shape and an arcuate shape along a diagonal of the concentric pinning stripes; applying directed-self-assembly solution over the pinning stripes, the directed-self-assembly solution having a pitch; annealing the directed-self-assembly solution to provide a first polymer and a second polymer arranged in alternating lines along the pinning stripes; removing the first polymer; etching a trench in the substrate at locations previously occupied by the first polymer; and depositing a metal in the trench.

Example 20 includes the subject matter of Example 19, wherein the pitch is 80 nm or less.

Example 21 includes the subject matter of Example 19, wherein the pitch is 40 nm or less.

Example 22 includes the subject matter of any of Examples 19-22, wherein the plurality of concentric pinning strips has a pinning stripe pitch that is a whole-number multiple of the pitch.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit die comprising:
   an active area including one or more semiconductor devices;
   a first guard ring surrounding the active area, the first guard ring defining a distinct, closed rectangular loop with rounded corners;
   a second guard ring concentric with and encompassing the first guard ring, wherein the second guard ring defines a distinct, closed rectangular loop with rounded corners, wherein the first guard ring is part of a first plurality of guard rings, and the second guard ring is part of a second plurality of guard rings, and each of the first and second pluralities includes at least three concentric guard rings, and, wherein the first plurality of guard rings, the second plurality of guard rings have a pitch of 40 nm or less; and
   a third guard ring concentrically arranged between the first guard ring and the second guard ring, the third guard ring defining a generally rectangular shape and having a defect at a corner region between the rounded corners of the first guard ring and the second guard ring.

2. The integrated circuit die of claim 1, wherein the defect at the corner region is part of a plurality of defects that includes a defect at every corner region of the third guard ring between the first guard ring and second guard ring.

3. The integrated circuit die of claim 2, wherein the plurality of defects includes dislocations and/or disclinations.

4. The integrated circuit die of claim 1, wherein the defect includes a break in continuity.

5. The integrated circuit die of claim 1, wherein the first guard ring, the second guard ring, and third guard ring are located at least in part in a metallization layer vertically above the semiconductor device, wherein the first guard ring, the second guard ring, and the third guard ring encompass but do not overlap the active area as viewed from above.

6. The integrated circuit die of claim 1, wherein the first guard ring, the second guard ring, and third guard ring are located at least in part in a via layer vertically above the semiconductor device.

7. The integrated circuit die of claim 1, wherein the first guard ring and the second guard ring comprise a metal.

8. The integrated circuit die of claim 1, wherein the first guard ring and the second guard ring are free of the defect of the third guard ring.

9. A guard ring structure for an integrated circuit, the guard ring structure comprising:
   a first group of n concentric guard rings surrounding an active region of an integrated circuit, the n concentric guard rings of the first group having a guard ring pitch of less than 80 nm, wherein each of the n concentric guard rings of the first group has a single closed path distinct from an adjacent guard ring and defines a rectangular geometry with rounded corners;
   a second group of n concentric guard rings surrounding the active region of the integrated circuit, the n concentric guard rings of the second group encompassing the first group and having the guard ring pitch of less than 80 nm, wherein each of the n concentric guard rings of the second group has a single closed path distinct from an adjacent guard ring and defines a rectangular geometry with rounded corners; and
   a third group of m concentric guard rings surrounding the active region of the integrated circuit, the third group between the first and second groups, wherein a corner region of one or more of the m concentric guard rings includes a guard ring defect.

10. The guard ring structure of claim 9, wherein each of n and m is from 2 to 10.

11. The guard ring structure of claim 9, wherein each of n and m is from 4 to 7.

12. The guard ring structure of claim 9, wherein the n concentric guard rings are free of the guard ring defect included in the m concentric guard rings.

13. The guard ring structure of claim 9,
    wherein each of the first and second groups of n concentric guard rings includes a first guard ring and a second guard ring encompassing the first guard ring; and
    wherein the rounded corners of the first guard ring have a first radius of curvature and the rounded corners of the second guard ring have a second radius of curvature greater than the first radius of curvature, the first radius of curvature and the second radius of curvature being substantially equal for each of the first and second groups.

14. The guard ring structure of claim 13, wherein each series of n concentric guard rings includes a third guard ring larger than the second guard ring, and rounded corners of the third guard ring have a third radius of curvature greater than the second radius of curvature, wherein the first radius of curvature, the second radius of curvature, and the third radius of curvature are substantially equal for each of the first and second groups.

15. The guard ring structure of claim 14, wherein the first radius of curvature is from 40 to 60 nm, the second radius of curvature is from 65 to 85 nm, and the third radius of curvature is from 90 to 110 nm.

16. The guard ring structure of claim 9,
    wherein n is at least two and each of the first and second groups of n concentric guard rings includes a radially innermost guard ring and a radially outermost guard ring;
    wherein a radius of curvature for the rounded corners increases from a first radius of curvature for the radially innermost guard ring to an nth radius of curvature for the radially outermost guard ring, the first radius of curvature and the nth radius of curvature being substantially equal for each of the first and second groups.

* * * * *